United States Patent [19]

Kawano

[11] Patent Number: 5,239,656
[45] Date of Patent: Aug. 24, 1993

[54] SEMICONDUCTOR MEMORY DEVICE FOR SELF-CORRECTING DATA OUTPUT ERRORS BY TAKING THE LOGICAL PRODUCT OF FIRST AND SECOND IDENTICAL DATA OUTPUTS

[75] Inventor: Hiroaki Kawano, Tokyo, Japan

[73] Assignee: Oki Electric Industry Co., Ltd., Tokyo, Japan

[21] Appl. No.: 510,137

[22] Filed: Apr. 17, 1990

[30] Foreign Application Priority Data

Apr. 20, 1989 [JP] Japan ................ 1-46627[U]

[51] Int. Cl.⁵ .................. G06F 11/00; G06F 11/08
[52] U.S. Cl. ................... 395/800; 395/575;
371/40.4; 371/41; 365/94; 365/200; 365/201;
364/244.6; 364/244.7; 364/265.3; 364/266.5;
364/DIG. 1; 364/944.92
[58] Field of Search ............... 395/800, 575; 371/40.4,
371/41; 365/94, 200, 201

[56] References Cited

U.S. PATENT DOCUMENTS 4,958,352 9/1990 Noguchi et al. ............. 371/40.1
5,109,359 4/1992 Sakakibara et al. ........... 365/189.07

FOREIGN PATENT DOCUMENTS 0209050 1/1987 European Pat. Off. .
60-74034 4/1985 Japan .

OTHER PUBLICATIONS

Kitano, Y., Kohda, S., Kikuchi, H., Sakai, S., "A 4-M-bit Fullwafer ROM", IEEE Journal of Solid-State Circuits, vol. SC-15, No. 4, pp. 686–693 (Aug. 1980).

Primary Examiner—Thomas C. Lee
Assistant Examiner—Paul Harrity
Attorney, Agent, or Firm—Edward D. Manzo

[57] ABSTRACT

A self-error-correcting semiconductor memory device having a programmable ROM for storing first and second data, at least one temporary register for temporarily storing data and a one-time PROM for writing one time, wherein first data stored in a true address and second data identical to the first data stored in a dummy address both within the programmable ROM are outputted to a data bus and multiplied with each other so as to obtain a third data for performing an error correction.

7 Claims, 10 Drawing Sheets

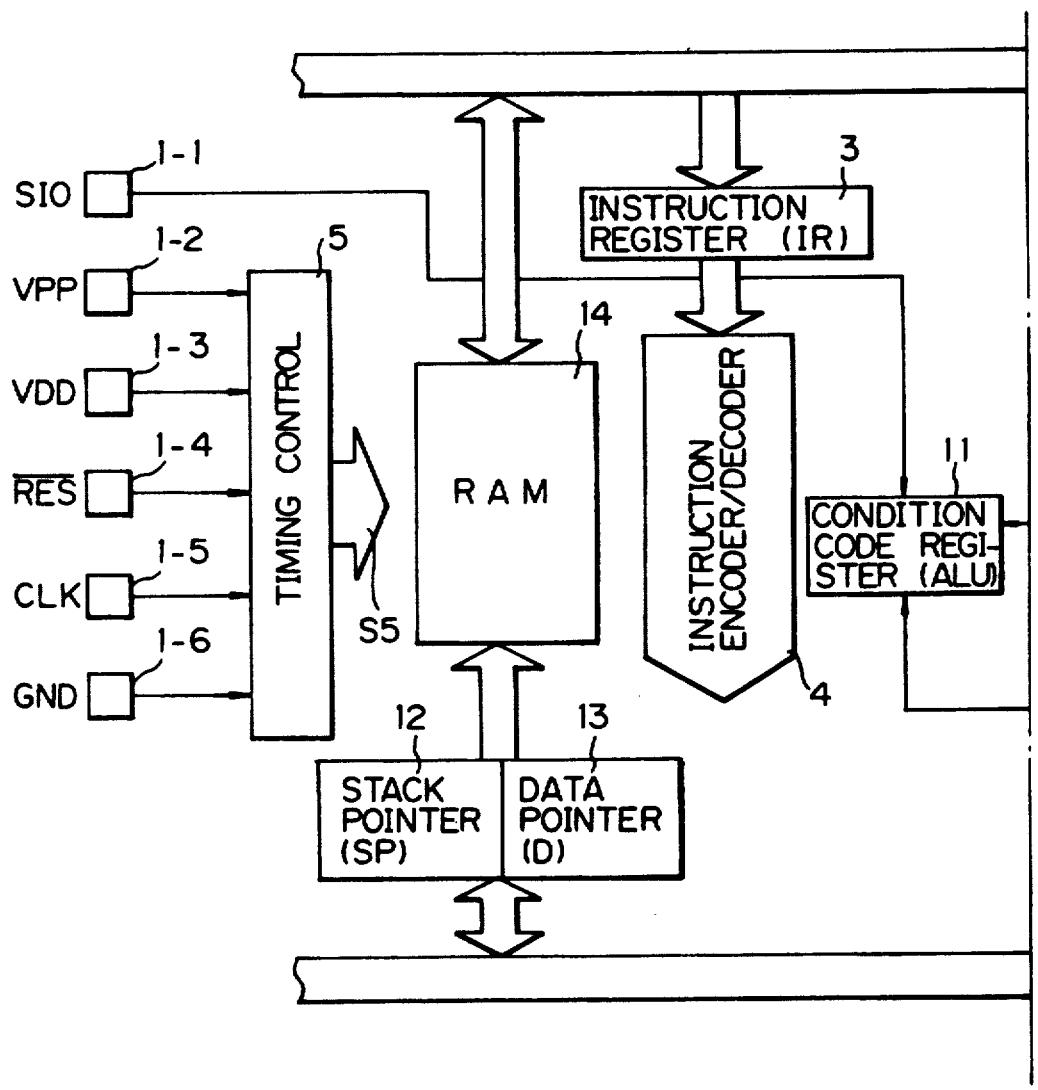
Fig. IA

Fig.6

| | M1 | | | | M2 | | | |
|---|---|---|---|---|---|---|---|---|
| | T1 | T2 | T3 | T4 | T1 | T2 | T3 | T4 |
| | | | | | | | | |
| | | | | | | | | |
| | | | | | | | LATCH ADDRESS | |
| | | | | | | | | |
| | SAVE CURRENT ADDRESS (H,L) | | | | SET REAL ADDRESS X (H,L) | | | |

| | M3 | | | | M4 | | | |
|---|---|---|---|---|---|---|---|---|
| | T1 | T2 | T3 | T4 | T1 | T2 | T3 | T4 |
| | EROM | | | | EROM | | | EALU |
| | | | | | | | | |
| | WTRC | | LATCH ADDRESS | | WTRB | | | WM |
| | | | | | | | | |
| | STORE DATA DoX OF REAL ADDRESS X | SET DUMMY ADDRESS Y | | RESTORE CURRENT ADDRESS (L) | STORE DATA DoY OF DUMMY ADDRESS Y | | RESTORE CURRENT ADDRESS (H) | STORE DoX·DoY IN RAM DoX·DoY |

Fig. 7

| | M1 | | | | M2 | | | |
|---|---|---|---|---|---|---|---|---|
| | T1 | T2 | T3 | T4 | T1 | T2 | T3 | T4 |
| | | | | | | | | |
| | | | | | | | | |
| | | | | | | | LATCH ADDRESS | |
| | | | | | | | | |
| | | SAVE CURRENT ADDRESS (H,L) | | | SET REAL ADDRESS X (H,L) | | | |

| | M3 | | | | M4 | | | |
|---|---|---|---|---|---|---|---|---|
| | T1 | T2 | T3 | T4 | T1 | T2 | T3 | T4 |
| | EROM | | | | EROM | | EM | EALU |
| | | | | | BFF | | | |
| | WTRC | | LATCH ADDRESS | | WTRB | | WTRC | WZF |
| | | | | | | | | |
| | STORE DATA DoY OF REAL ADDRESS X | SET DUMMY ADDRESS Y | | RESTORE CURRENT ADDRESS (L) | STORE DoX·DoY IN TRB | RESTORE CURRENT ADDRESS (H) | STORE COMPARISON DATA | LEAVE RESULT OF COMPARISON IN ZF |

Fig. 9

| | M1 | | | | M2 | | | |
|---|---|---|---|---|---|---|---|---|
| | T1 | T2 | T3 | T4 | T1 | T2 | T3 | T4 |
| | | | | | | | | |
| | | | | | | | | |
| | | | | | | | LATCH ADDRESS | |
| | | | | | | | | |

SAVE CURRENT ADDRESS (H,L) — SET READ ADDRESS (H,L) — RESTORE CURRENT ADDRESS (L)

| | M3 | | | | M4 | | | |
|---|---|---|---|---|---|---|---|---|
| | T1 | T2 | T3 | T4 | T1 | T2 | T3 | T4 |
| | EROM | | EM | EALU | | | | |
| | | | | | | | | |
| | WTRB | | WTRC | WZF | | | LATCH ADDRESS | |
| | | | | | | | | |

READ DATA — READ COMPARISON DATA — COMPARE DATA — RESTORE CURRENT ADDRESS (H)

SEMICONDUCTOR MEMORY DEVICE FOR SELF-CORRECTING DATA OUTPUT ERRORS BY TAKING THE LOGICAL PRODUCT OF FIRST AND SECOND IDENTICAL DATA OUTPUTS

BACKGROUND OF THE INVENTION

1. Field of the Invention

The present invention generally relates to a microcomputer having an erasable programmable ROM (EPROM) built therein. More particularly, the present invention is concerned with a procedure for correcting errors of a microcomputer having thereinside a one-time PROM which is one of EPROMs available today and allows data to be written therein only once.

2. Description of the Prior Art

Some modern single-chip microcomputers applicable to IC cards, for example, have an EPROM built therein. This type of microcomputer allows the user to write a microcomputer application program or data therein as desired and, therefore, promotes the cut-down of development turn-around time (TAT). A one-time PROM (OTP) belongs to a family of EPROMs and has a package which is not provided with a window for erasing data. Such a one-time PROM is inexpensive although data cannot be written therein more than once.

An EPROM has a FAMOS structure, i.e., it is implemented as a silicon gate MOS type FET which is provided with a floating gate. Such a FET stores data "0" when an electron is injected into and stored in the floating gate or data "1" when no electrons are injected. Generally, the data stored in this type of EPROM may be erased by applying ultraviolet rays thereto. With a one-time PROM, however, it is impossible to erase data because this type of PROM is implemented by an inexpensive plastic mold package which has no windows for admitting the radiation. For details of an EPROM and a one-time ROM, a reference may be made to Natsui "MOS Memory: EPROM, Ultra-LSI Technology & Application", No. 3, pp. 37-42, Ohm Sha, Japan, and "Operative Analysis and Testing Methods for EPROMs", Nikkei Electronics, Independent Volume, pp. 181-201 (1981).

Since a one-time PROM inhibits data written therein from being erased and does not allow data to be written therein more than once, a one-chip microcomputer loaded with a one-time PROM has some problems, as follows. Specifically, once the one-time PROM is loaded in a package, it cannot be subjected to a writing test during the course of production and, consequently, it is delivered to a customer without being fully tested. This brings about a fear that defective products which will not allow users to write data therein are delivered together with defectless products. Although some of such defective one-time PROMs may safely write data therein, the charges stored in the floating gates will disappear in due course due to the short operation margin and, as a result, the stored data will be changed. The user, therefore, cannot use a one-time PROM without once writing data in the PROM, then baking it over a predetermined period of time, and then checking the data for changes in order to confirm the operation margin. As discussed above, since a writing test is impracticable with a one-time PROM in the production line after it has been loaded in a package, the probability that a writing error occurs at the users stage is high. It has been reported that the ratio of such defective products is as great as 1% to 0.1%, limiting the reliability of data writing available with a one-time ROM.

In the light of the above, the inventor has proposed a microcomputer having an implementation for making up for the disadvantages of a one-time PROM, as shown and described in Japanese Patent Laid-Open Publication No. 173147/1989. The microcomputer disclosed in this Patent Publication is capable of correcting errors when data are read out of a one-time PROM.

However, the microcomputer disclosed in the above Patent Publication has a problem stemming from the fact that it corrects errors by program control, i.e. software. Specifically, this microcomputer needs a great number of instructions for reading data out of a real address X and a dummy address Y of a one-time ROM which are loaded with the same data, and ANDing the read data. An increase in the number of instructions directly translates into an increase in the number of processing steps and, therefore, into an increase in processing time.

SUMMARY OF THE INVENTION

It is therefore an object of the present invention to provide a microcomputer with a built-in PROM which is capable of correcting errors by a minimum number of instructions and, therefore, a minimum of processing time.

A microcomputer with a built-in PROM of the present invention comprises a writing circuit for writing single data in a first address of the PROM designated by a program counter, and a second address of the PROM having a predetermined relation to the first address, and a reading circuit for reading first data out of the first address of the PROM designated by the program counter and second data out of the second address of the PROM. The microcomputer further comprises a control circuit for controlling individual functioning sections of the microcomputer, and an AND circuit for producing AND of the first and second read data on a precharge type data bus. The program counter has an address converting circuit for replacing the first address with the second address in response to a control signal fed thereto from the control circuit.

In accordance with the present invention, to correct an error of a one-time ROM, the program counter sets the first address while the address converting circuit automatically sets the second address having a predetermined relation to the first address. First and second data read out of the first and second addresses, respectively, are ANDed on the data bus. Such an procedure replaces the program control heretofore relied on for error correction with hardware, i.e. automatic error correction. Hence, the number of necessary instructions is reduced to in turn reduce the number of processing steps and, therefore, the processing time as well as the area of the memory to be allocated to programs.

BRIEF DESCRIPTION OF THE DRAWINGS

The objects and features of the present invention will become more apparent from the consideration of the following detailed description taken in conjunction with the accompanying drawings in which:

FIGS. 1A and 1B are schematic block diagrams showing, when combined as shown in FIG. 1, a microcomputer with a built-in PROM embodying the present invention;

FIGS. 6 and 7 are charts demonstrating respectively a read instruction procedure and a compare instruction procedure particular to the microcomputer with a built-in PROM of the present invention; and FIGS. 8 and 9 are charts respectively representative of a read instruction procedure and a compare instruction procedure of a prior art microcomputer with a built-in PROM.

DESCRIPTION OF THE PREFERRED EMBODIMENT

Figure 1B:
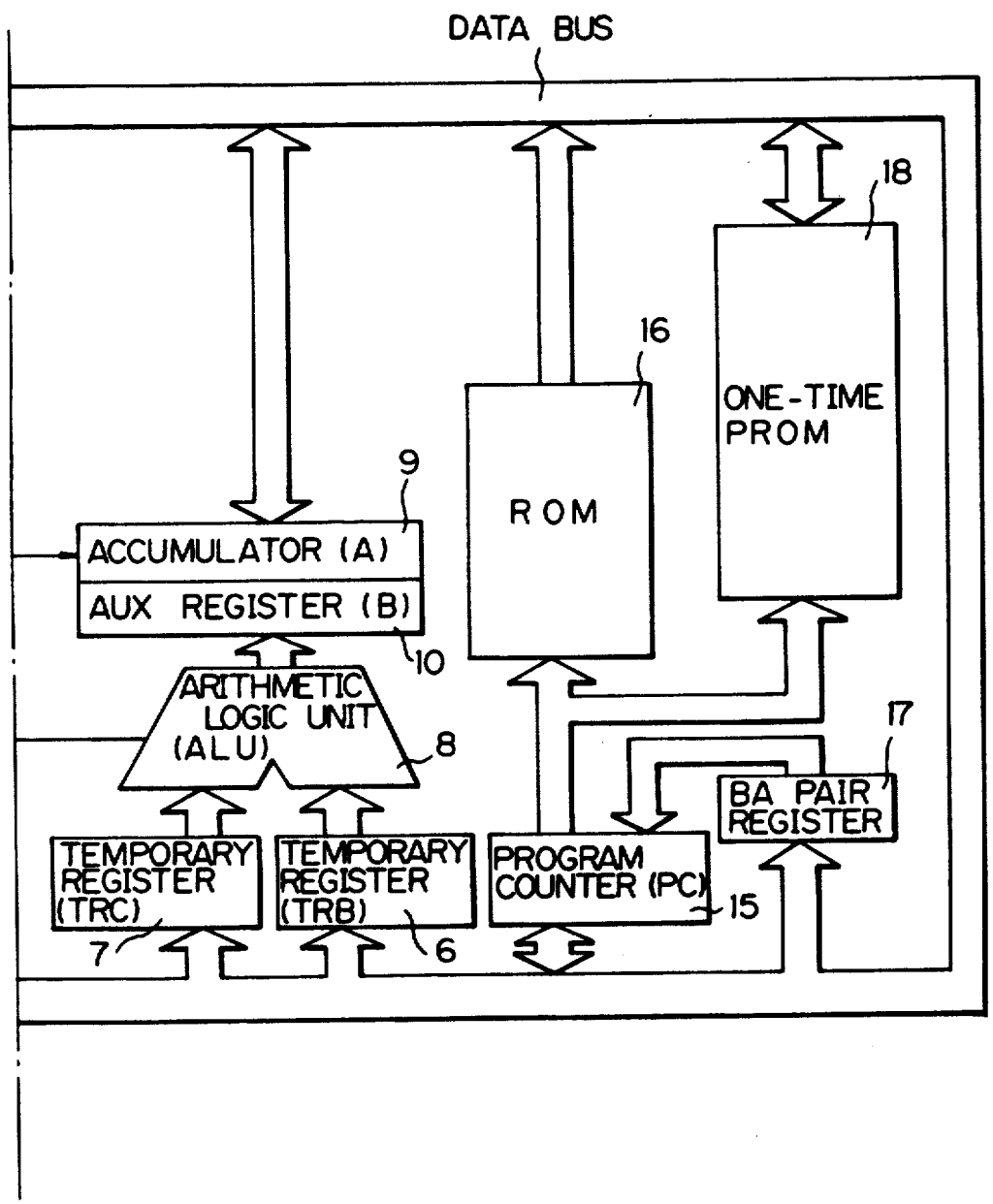

Referring to FIGS. 1A and 1B of the drawings, the overall arrangement of a microcomputer with a built-in PROM embodying the present invention is shown. Incorporated in an IC card, for example, the microcomputer has a serial data input/output (SIO) terminal 1-1, a write high voltage (VPP) terminal 1-2, a power source voltage (VDD) terminal 1-3, a reset signal ($\overline{\text{RES}}$) terminal 1-4, a clock signal (CLK) terminal 1-5, a ground potential (GND) terminal 1-6, and an internal data bus 2. An instruction register (IR) 3 is interconnected to the data bus 2 and temporarily holds an instruction read out. An instruction decoder/encoder 4 may be implemented as a programmable logic array (PLA) and is interconnected to the data bus 2 via the instruction register 3 so as to decode and encode an instruction. The output signal of the instruction decoder/encoder 4 is fed to various circuit sections of the microcomputer.

Signals coming in through the terminals 1-2 to 1-6 are applied to a timing control circuit 5. In response, the timing control circuit 5 generates various kinds of control signals S5 and delivers them to various circuit sections of the microcomputer. Specifically, in response to a clock signal CLK coming in through the terminal 1-5, the timing control circuit 5 generates the control signals S5 including a timing signal which sets up a basic timing for causing the circuit sections of the microcomputer to operate. The control signals S5 also include a precharge signal PRC for controlling the state of the data bus 2 which is implemented by a precharging system, as described in detail later.

The instruction decoder/encoder 4 outputs various kinds of control signals in response to an instruction which is read via the instruction register 3. These control signals include EM, EROM, EALU, WTRB, WTRC, WM, WZF, and BFF. Among them the control signals EM, EROM and EALU enable a RAM 14 one-time ROM 18 and an arithmetic and logic unit (ALU) 8, respectively. The control signals WTRB and WTRC instruct respectively a temporary register (TRB) 6 and a temporary register (TRC) 7 to store data therein. The control signal WM instructs a RAM 14 to store data therein. The control signal WZF instructs a condition code register 11 to write a particular state in ZERO flag which is included in the register 11, while the control signal BFF commands the stop of data output. The instruction decoder/encoder further generates a test signal TES, a set address signal SET, an upper byte write signal WPCH, an up signal U, a down signal DOWN, and an up-down signal UP/DOWN. The test signal TES is adapted for evaluation and test. The set address signal SET is used to set an address in a program counter 15, while the upper byte write signal WPCH instructs the program counter 15 to write data in its upper byte H which will be described. The up signal U, down signal D and up/down signal UP/-DOWN are used to change the content of address data which is set in the program counter 15.

The temporary registers 6 and 7 are interconnected to the internal data bus 2. The output terminals of the temporary registers 6 and 7 are interconnected to the data bus 2 via the arithmetic and logic unit 8, an accumulator (ACC) 9 which will be sometimes referred to as an A register, and an auxiliary register 10 which will be sometimes referred to as a B register. The arithmetic and logic unit 8 and accumulator 9 are interconnected to the input terminal 1-1 via the condition code register 11 which has a plurality of flags including the ZERO flag.

A data pointer (D) 13 is interconnected to the internal data bus 2 in order to designate an address of the RAM 14 when data is to be written to or read out of the RAM 14. Also interconnected to the data bus 2 is a stack pointer (SP) 12 which designates the address of a particular area of the RAM 14 for saving data having been stored in another area of the RAM 14. The data pointer 13 and stack pointer 12 are interconnected to the data bus 2 via the RAM 14 which stores working data and other data. Further interconnected to the data bus 2 are the program counter 15, the ROM 16 loaded with a control program and other necessary programs, a BA pair register 17 for designating an address of the one-time PROM 18, and the one-time PROM 18 adapted to store data. The program counter 15 stores a particular location of the ROM 16 where an instruction to be read out next exists. For this purpose, the program counter 15 has sixteen bits a left half of which (bits #15 to #8) constitutes an upper byte H and a right half of which (bits #7 to #0) constitute a lower byte L.

The program counter 15 receives address data associated with the one-time PROM 18 from the BA pair register 17 and in turn designates an address of the one-time PROM 18 when data is to be written to or read out of the PROM 18.

Figure 2:
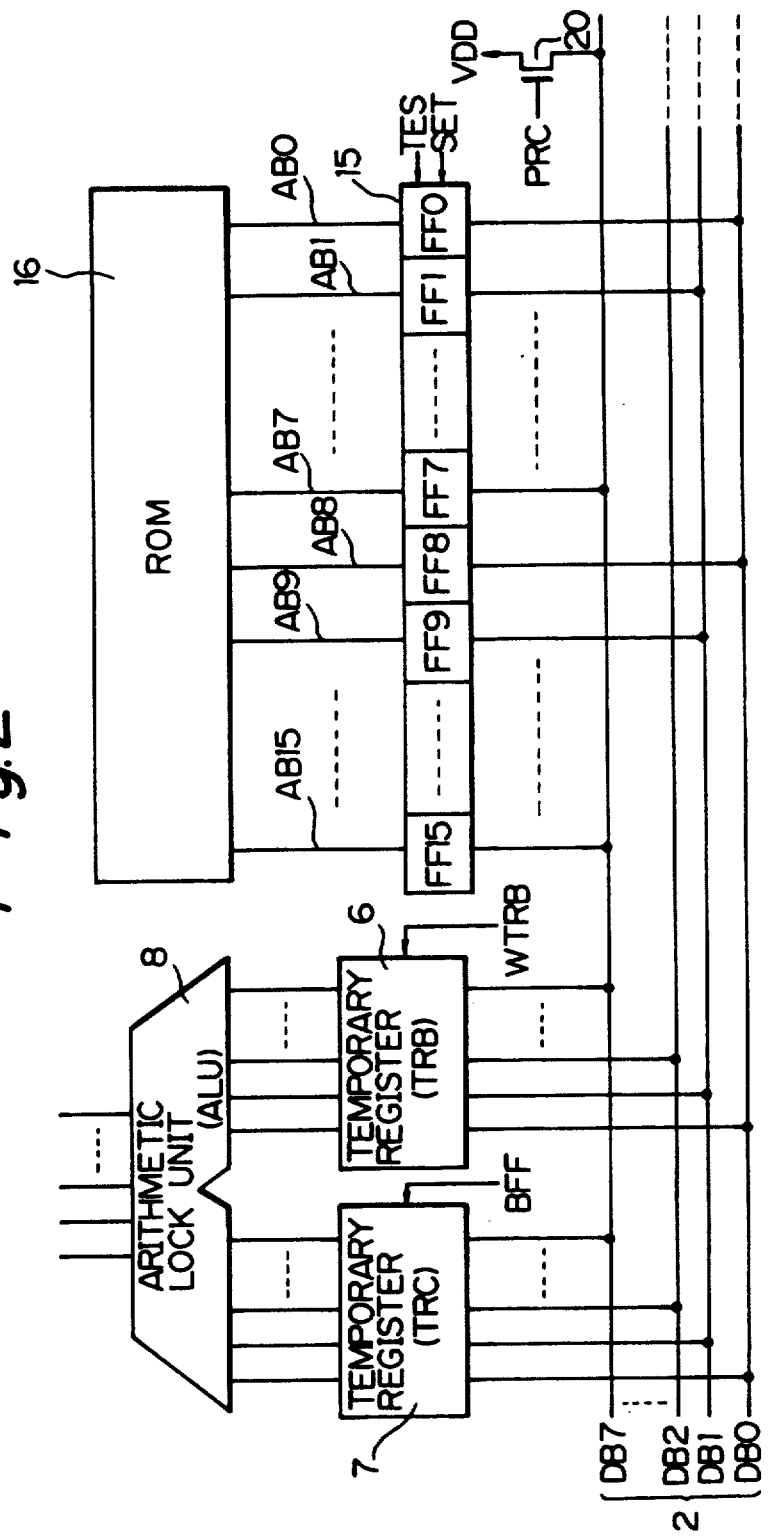
FIG. 2 is a block diagram schematically showing a specific construction of an essential part of the microcomputer shown in FIG. 1.

Referring to FIG. 2, a specific construction of an essential part of the microcomputer shown in FIG. 1 is depicted. As shown, the internal data bus 2 is implemented by a precharging system and constituted by, for example, eight signal lines or bits DB0 to DB7. Pull-up circuits 20 are interconnected to respective signal lines DB0 to DB7. Specifically, the pull-up circuits 20 are interconnected between a power source line and the signal lines DB0 to DB7 and are each comprised of a MOS transistor, for example. A precharge signal PRC is coupled to the gate of the MOS transistor 20. When the precharge signal PRC is in a high level or "H", the pull-up circuit or MOS transistor 20 is rendered conductive with the result that the voltage on the data bus 2 is elevated to the source voltage VDD.

Data are inputted to and outputted from the temporary registers 6 and 7 under the control of the control signals WTRB, BFF and so forth which are generated by the instruction decoder/encoder 4, FIG. 1A. The arithmetic and logic unit 8 is interconnected to the output terminals of the temporary registers 6 and 7.

The program counter 15 has an address converting circuit 21 and is controlled by the test signal TES, set address signal SET and other control signals which are fed thereto from the instruction decoder/encoder 4. For the program counter 15, use may be made of sixteen flip-flops each having a latching function. In the specific construction shown in FIG. 2, flip-flops FF0 to FF7 and flip-flops FF8 to FF15 constitute respectively the previously mentioned 8-bit lower byte L and 8-bit upper byte H of the program counter 15. The flip-flops FF0 to FF15 are interconnected to the ROM 16 via address signal lines AB0 to AB15, respectively.

Figure 3:
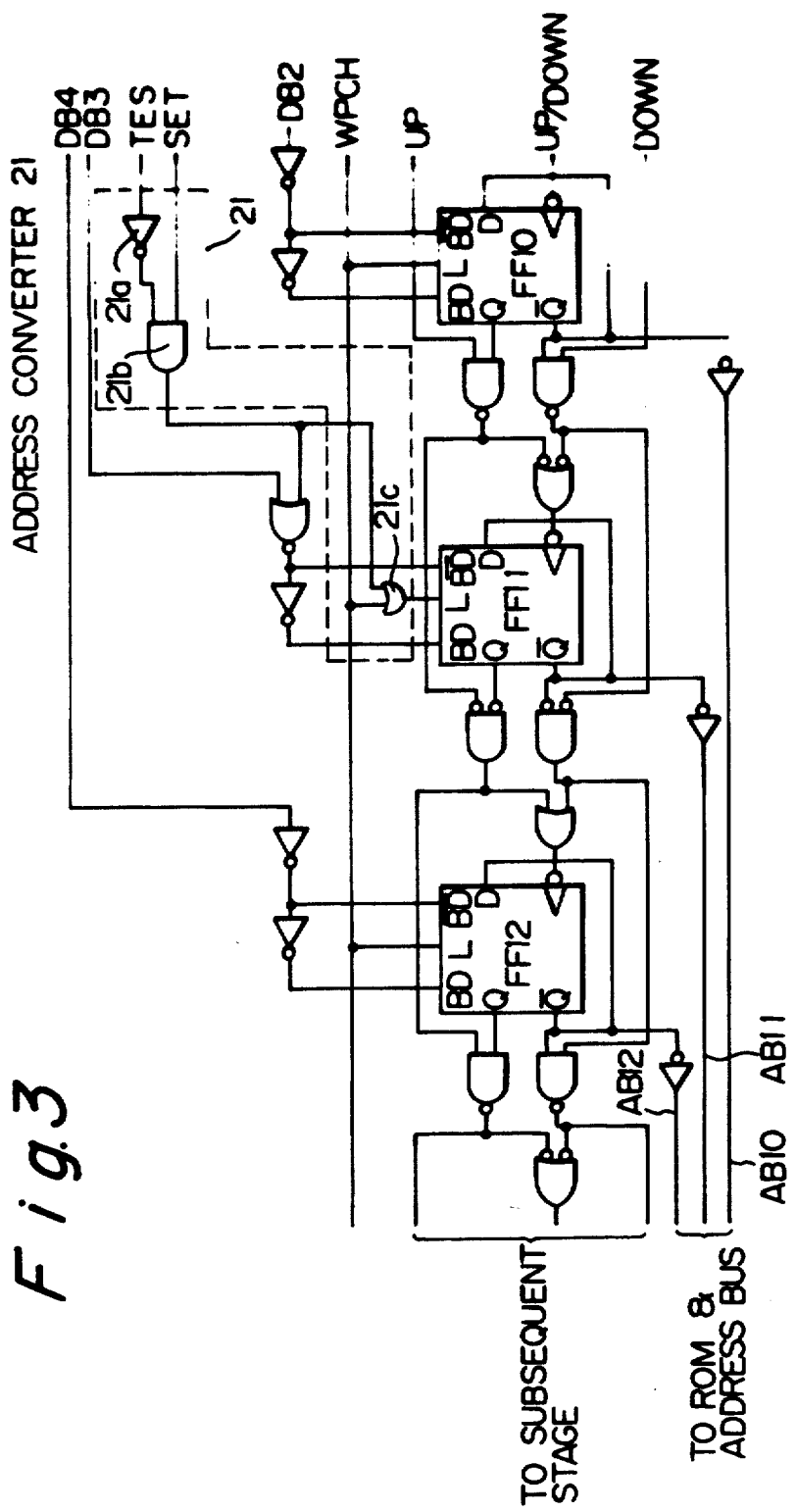
FIG. 3 is a circuit diagram indicating a specific construction of a program counter shown in FIG. 2.

FIG. 3 shows a specific arrangement of the program counter 15 which is included in the construction of FIG. 2. Each of the flip-flops FF10 to FF12 with a latching function has an output terminal $\bar{Q}$ and an input terminal D which are interconnected to each other. The upper byte write signal WPCH is fed to latch input terminals L of the individual flip-flops FF10 to FF12. When the signal WPCH is in the "H" level, the flip-flops FF10 to FF12 take in respectively the data from the signal lines DB2, DB3 and DB4 via terminals BD and $\overline{BD}$. Clocked by the up-down signal UP/DOWN, each of the flip-flops FF10 to FF12 produces a signal of "H" level or "L" level on its output terminals Q and $\bar{Q}$ and thereby increments by 1.

In response to a jump instruction, the up signal UP or the down signal DOWN is fed to the flip-flops FF10 to FF12. Then, the flip-flops FF10 to FF12 perform a jumping operation such as an increment by 2 or a decrement by 3. The address converting circuit 21 is made up of an inverter 21a, an AND gate 21b, and an OR gate 21c and connected to the latch input terminal L of the flip-flop FF11. The inverter 21a inverts the test signal TES while the AND gate 21b produces AND of the inverted test signal TES and the set address signal SET. The OR gate 21c ORs the AND and the upper byte write signal WPCH, delivering the resultant OR to the latch input terminal L of the flip-flop FF11. Address data of an opposite phase appearing on the output terminals $\bar{Q}$ of the flip-flops FF10 to FF12 are transformed into address data of a positive phase by associated inverters and then fed out to the address lines AB10 to AB12 which implement the ROM 16 and address bus 2.

Figure 4:
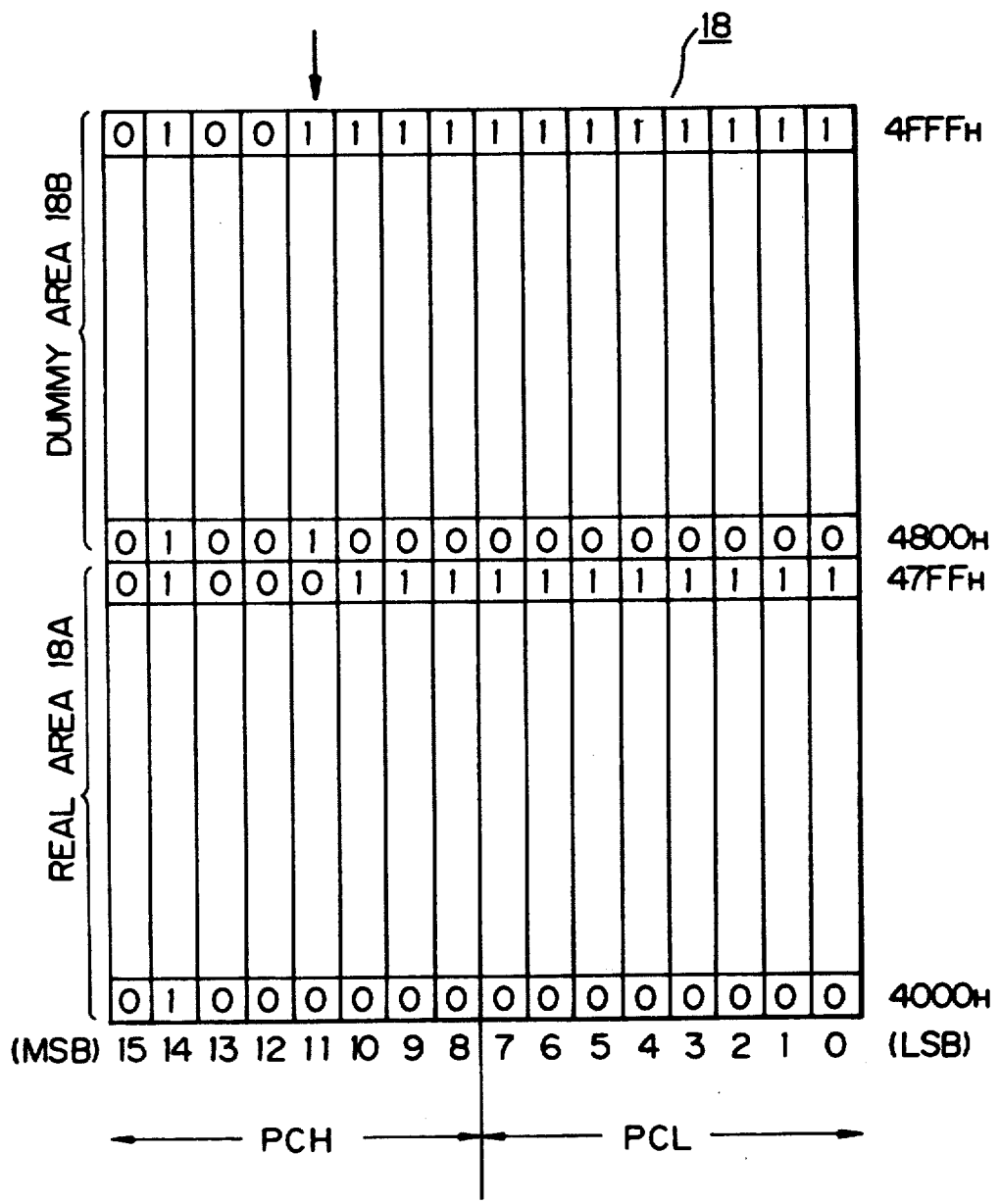
FIG. 4 shows specific contents of storage areas of a one-time PROM included in the microcomputer of FIG. 1.

The one-time PROM 18 shown in FIG. 1B may be constructed as indicated in FIG. 4. As shown, the one-time PROM 18 has a real storage area 18A usable for writing or reading data which are actually used, and a dummy storage area 18B usable for writing or reading data which are adapted to correct errors of the actual data written in or read out of the real storage area 18A. The real area 18A has read addresses X which are 4000H to 47FFH (2 kilobytes), while the dummy area 18B has dummy addresses Y which are 4800H to 4FFFH (2 kilobytes). With this configuration, it is possible to replace any one of the real addresses X with the associated dummy address Y by causing the flip-flop FF 11 constituting the twelfth bit of the program counter 15 to produce "1" on its output terminal Q.

Figure 5:
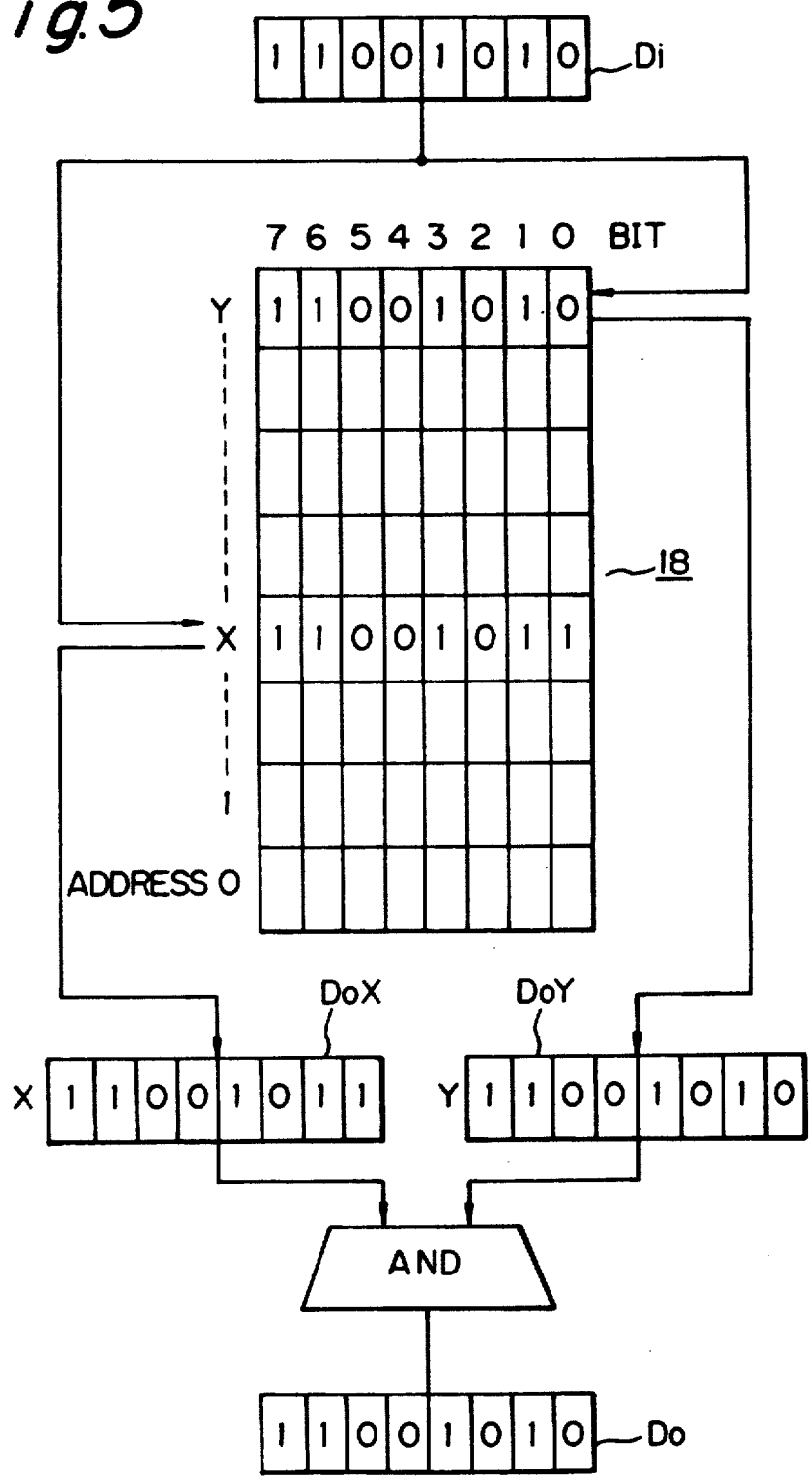
FIG. 5 is chart outlining how the microcomputer shown in FIG. 1 corrects a data error.

A reference will be made to FIG. 5 for describing the error correcting operation of the microcomputer, i.e., how an error of data having been written in the one-time PROM 18 are corrected.

Let it be assumed that the one-time PROM 18 represents the presence of data in its cell by "0" and the absence of data by "1". Then, all the cells of the one-time PROM 18 are "0" at the initial stage. When data is written to any one of the cells to turn the status of the latter from "1" to "0", it is likely that the status of the cell changes from "0" to "1" later due to a short writing voltage or a defect of the cell. In the light of this, input data Di (e.g. 8-bit data "11001010") is written to a real address X belonging to the real area 18A and a dummy address Y belonging to the dummy area 18B and associated with the real address X; the real and dummy addresses X and Y electrically do not interfere with each other. As shown in FIG. 5, assume that the zero-th bit of the real address X has changed from "0" to "1" due to any of the above-mentioned causes. Then, the data are read out of the real address X and dummy address Y, and the resultant data DoX and DoY are ANDed to produce corrected output data Do. Why this is possible stems from the fact that data stored in a one-time PROM may change from "0" to "1", but it will never change from "1" to "0". More specifically, since a one-time PROM writes data "0" by storing an electron on a floating gate and writes "1" when an electron is absent, an electron will never be stored except by a writing operation although a stored electron may disappear due to leakage, for example.

Referring to FIGS. 6 and 7, a read instruction procedure and a compare instruction procedure to be executed by the microcomputer in accordance with the present invention will be described.

(1) Basic Procedure

To read data out of the storage areas of the one-time PROM 18 which are designated by the read address X and the associated dummy address Y, and produce AND of the two data sequences to thereby determine corrected data, the following steps (a) to (e) are necessary.

(a) The address of the ROM 16 currently designated by the program counter 15 is saved in the temporary registers 6 and 7.

(b) The real address X of the one-time PROM 18 is set in the program counter 15, and then data is read out of the area of the one-time PROM 18 which is designated by the real address X.

(c) The dummy address Y of the one-time PROM 18 is set in the program counter 15, and then data is read out of the area of the one-time PROM 18 which is designated by the dummy address Y.

(d) The address data saved in the temporary registers 6 and 7 by the step (a) is restored to the current program counter 15, and then the program counter 15 is incremented by 1.

(e) The data DoX read out of the area of the one-time PROM 18 which is designated by the real address X and the data DoY read out of the area of the one-time PROM 18 which is designated by the dummy address Y are ANDed in binary notation on the data bus 2. The resultant AND, or corrected data Do, is stored in the RAM 14, FIG. 1A.

Assuming that the above sequence of steps (a) to (e) are executed by use of four machine cycles M1 to M4 and four states or timings T1 to T4, the read instruction procedure and compare instruction procedure proceed as described hereinafter. It is to be noted that the term "one state" refers to one period of the clock signal CLK.

(2) Read Instruction Procedure (FIG. 6)

A read instruction MOV @D, @BA is executed for transferring the data stored in the area of the address of the one-time PROM 18 which is held in the BA pair register 17, FIG. 1B, to the area of the RAM 14 whose address is indicated by the data pointer 13, as follows.

First, in the states T3 and T4 of the machine cycle M1, the contents of the upper byte H and lower byte L of the program counter 15, i.e., address data are moved to the temporary registers 6 and 7 so as to save the current address.

Subsequently, in the states T2 and T3 of the machine cycle M2, the address data associated with the one-time PROM 18 and stored in the BA pair register 17, FIG. 1B, is transferred to the upper byte H and lower byte L of the program counter 15. This loads the program counter 15 with the address data representative of the real address X. Then, the program counter latches the real address X in the real area 18A of the one-time PROM 18.

In the state T1 of the machine cycle M3, the instruction decoder/encoder 4 delivers the control signal EROM to the one-time PROM 18 to read the data DoX out of the area of the read address X of the one-time PROM 18 which has been designated by the program counter 15. The data DoX read out is outputted to the data bus 2. At this instant, the instruction decoder/encoder 4 feeds the control signal WTRC to the temporary register 7, so that the data DoX outputted from the one-time PROM 18 to the data bus 2 is loaded in the temporary register 7.

In the state T2 of the machine cycle M3, the set address signal SET, FIG. 3, turns from the "L" level to the level "H" level. The test signal TES allows the dummy address Y to be set when in the "L" level and does not allow it to be set when in the "H" level. In the state T2 of the machine cycle M3, the test signal TES is turned to the "L" level while the set address signal SET is turned to the "H" level. As a result, the flip-flop FF11 representative of the content of the twelfth bit of the program counter 15 as counted from the least significant bit (LSB) changes the level of its output terminal Q to "1", whereby the address set in the program counter 15 is switched over from the read address X to the dummy address Y. After the dummy address Y has been so set in the program counter 15, the program counter 15 latches the dummy address Y of the dummy area 18B of the one-time PROM 18 in the state T3 of the machine cycle M3. In the subsequent state T4 of the machine cycle M3, among the address data associated with the program counter 15 and saved in the machine cycle M1 as stated earlier, the address data of the lower byte (L) is restored to the program counter 15.

Thereafter, in the state T1 of the machine cycle M4, the instruction decoder/encoder 4 delivers the control signal EROM to the one-time PROM 18. In response, the data DoY is read out of the area of the dummy address Y which has been designated by the program counter 15. The data DoY is also fed out to the data bus 2. At this instant, the instruction encoder/decoder 4 feeds the control signal WTRB to the temporary register 6, whereby the data DoY on the data bus 2 is loaded in the temporary register 6.

In the state T3 of the machine cycle M4, the address data of the upper byte H associated with the program counter 15 and saved in the machine cycle M1 is restored to the program counter 15, in the same manner as the address data of the lower byte L. In the subsequent state T4, the instruction decoder/encoder 4 sends the control signal EALU to the arithmetic and logic unit 8 to enable the later. Consequently, the arithmetic and logic unit 8 produces AND of the data DoX and DoY lodged in the temporary registers 7 and 6, respectively. Further, in the state T4, the instruction decoder/encoder 4 delivers the control signal WM to the RAM 14 with the result that the AND, i.e., DoX.DoY is written to the address of the RAM 14 which is designated by the data pointer 13, FIG. 1A. If desired, an arrangement may be so made as to effect this ANDing on the data bus 2 without using the arithmetic and logic unit 8, as will be described.

(3) Compare Instruction Procedure (FIG. 7)

A compare instruction CMP @D, @BA is executed for determining whether or not the data stored in the area of the address of the one-time PROM 18 which is lodged in the BA pair register 17, FIG. 1A, and the data stored in the area of the RAM 14 which is designated by the data pointer 13 are identical and, if the answer is positive, setting the ZERO flag of the condition code register 11, FIG. 1A. A specific application of this compare instruction is such that whether or not a code registered in the one-time PROM 18 and a code inputted from the input terminal 1-1 to the RAM 14 via the condition code register 11 and accumulator 9 are identical and, if they are identical, the ZERO flag is set, so that cash dispensing processing or similar processing may be executed on the basis of the result of the decision.

The compare instruction procedure described above proceeds in the same manner as the procedure of FIG. 6 up to the machine cycle M3. Particularly, in the state T2 of the machine cycle M3, the changeover from the real address X to the dummy address is effected by the program counter 15, i.e., by hardware. It should be noted that in the state T4 of the machine cycle M3 the data DoX stored in the real address X of the one-time PROM 18 has been outputted from the temporary register 7 to the data bus 2, while the dummy address Y in the one-time PROM 18 has been designated.

In the state T1 of the machine cycle M4, the instruction decoder/encoder 4 delivers the control signal EROM to the one-time PROM 18 so as to output the data DoY stored in the area of the dummy address Y of the one-time PROM 18 to the data bus 2. At this instant, the instruction decoder/encoder 4 has fed the control signal BFF to the temporary register 6 for inhibiting data from being outputted. As a result, the data DoY is outputted to the data bus 2 over the previous data DoX existing on the data bus 2. Hence, if any of the bits of either one of the data DoX and DoY is "0", then the signal line associated with that bit is brought to the ground potential Vss (="0"). Stated another way, the data bus 2 produces AND of the data DoX and DoY and thereby produces the corrected data Do.

In the state T1 of the machine cycle M4, after the data DoX and DoY have been ANDed as stated above, the instruction decoder/encoder 4 feeds the control signal WTRB to the temporary register 6. Consequently, the data Do which is the result of ANDing is loaded in the temporary register 6. In the subsequent state T2, among the address data of the program counter 15 saved in the states T3 and T4 of the machine cycle M1, the address data of the upper byte H is restored to the program counter 15. In the state T3, the instruction decoder/encoder 4 delivers the control signals EM and WTRC to the RAM 14 and temporary register 7, respectively. As a result, data is read out of the area of the RAM 14 associated with the address which the data pointer 13 indicates, and then stored in the temporary register 7.

In the state T4 of the machine cycle M4, the instruction decoder/encoder 4 sends the control signals EALU and WZF to the arithmetic and logic unit 8 and condition code register 11, respectively. In response, the arithmetic and logic unit 8 compare the data stored in the temporary registers 6 and 7, and the result of comparison is recorded in the ZERO flag of the condition code register 11.

The illustrative embodiment shown and described has the following advantage. A read correction program stored in the ROM 16 can be implemented by a minimum number of instructions, e.g., only three successive instructions (i), (ii) and (iii), as follows:

(i) Transferring to the data pointer 12 an address #NA representative of the area of the RAM 14 where data read out of the one-time PROM 18 is to be stored (MOV D, #NA);

(ii) Transferring (double-moving) read addresses N1-1 (upper address) and N2-1 (lower address) of the one-time PROM 18 to the BA pair register 17 (MOVW BA, N1-1 N2-1); and (iii) Reading data out of the one-time PROM 18 (inclusive of data correction) (MOV @D, @BA), i.e., transferring data stored in an area of the one-time-PROM 18 associated with the address (real or dummy) indicated by the BA pair register 17 to an area of the RAM 14 which is associated with the address indicated by the data pointer 13.

In contrast, with the prior art microcomputer having a built-in PROM and lacking the construction shown and described, the above-stated read correction is impractiable unless as many as eleven instructions (i) to (xi) are used, as follows:

(i) Transferring to the data pointer 13 an address #NA representative of an area of the RAM 14 where data read out of the one-time PROM 18 is to be stored (MOV D, #NA), i.e., transferring a data storage area #NA in the program of the ROM 16 designated by the program counter 15 to the data pointer 13 (MOV D, #NA);

(ii) Transferring to the BA pair register 17 read addresses N1-1 (upper address) and N2-1 (lower address) of the one-time PROM 18 (MOVW BA, N1-1 N2-1);

(iii) First data reading, i.e., transferring or moving the data DoX stored in an area of the one-time PROM associated with a real address X which is indicated by the BA pair register 17 to an area of the RAM 14 associated with an address which is indicated by the data pointer 13 (MOV @D, @BA);

(iv) Saving the read data DoX, i.e., storing or pushing the read data DoX in an area of the RAM 14 which is designated by the stack pointer 12 (PUSH D);

(v) Transferring to the data pointer 13 an address #NB representative of an area of the RAM 14 where the data read out of the one-time PROM 18 is to be stored (MOV D, #NB);

(vi) Transferring to the BA pair register 17 read addresses N1-2 (upper address) and N2-2 (lower address) of the one-time PROM 18 (MOVW BA, N1-2 N12-2);

(vii) Second data reading, i.e., transferring to an area of the RAM 14 associated with an address designated by the data pointer 13 the data DoY which is stored in an area of the one-time PROM 18 associated with a dummy address Y indicated by the BA pair register 17 (MOV @D, @BA);

(viii) Transferring the read data DoY to the accumulator 9, i.e., transferring to the accumulator 9 the data stored in the area of the RAM 14 which is designated by the data pointer 13 (MOV ACC, @D);

(ix) Restoring the read data DoX, i.e., incrementing the address indicated by the stack pointer 12 by 1 and restoring the read data DoX saved in the area of the RAM 14 which is designated by the resultant address (POP D);

(x) ANDing the read data DoX and DoY, i.e., causing the arithmetic and logic unit 8 to produce AND of the data DoX stored in the area of the RAM 14 associated with the address indicated by the data pointer 13 and the data DoY set in the accumulator 9 (AND ACC, D); and (xi) Storing the corrected data in an area of the address #NA of the RAM 14, i.e., storing the output data Do of the accumulator 9 having been corrected by the accumulator (ACC) 9 in the area of the address #NA of the RAM 14 (MOV @D, ACC).

The need for such a number of instructions is ascribable to the fact that the prior art implements, among others, the error correction by software. A read instructing operation and a compare instructing operation particular to the prior art microcomputer with a built-in PROM will be discussed with reference to FIGS. 8 and 9, respectively.

Figure 8:
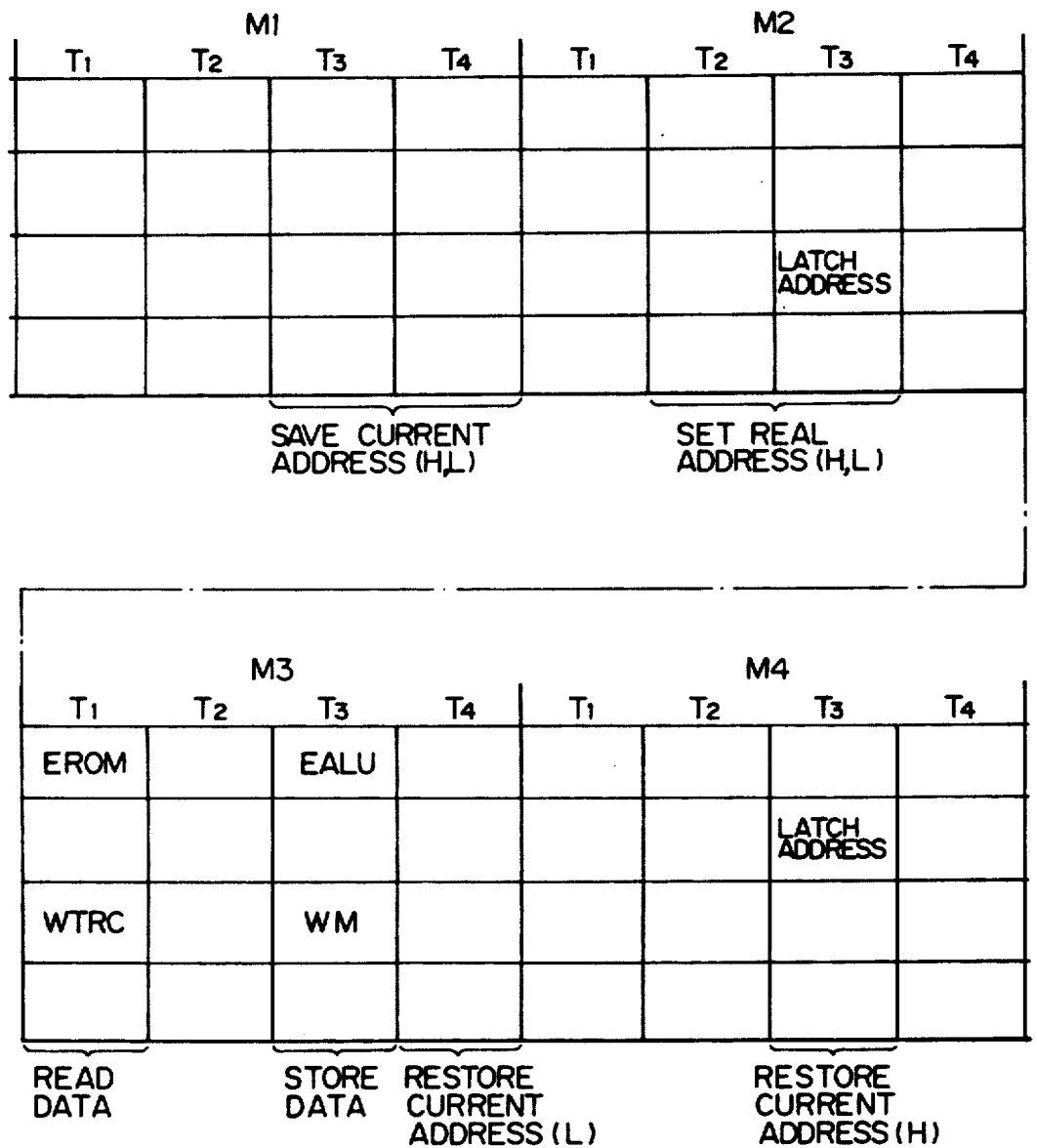

(1) Read Instruction Procedure (FIG. 8)

A read instruction MOV @D, @BA using four machine cycles M1 to M4 and four states (timings) T1 to T4, for example, is executed as follows. It is to be noted that the read instruction MOV @D, @BA refers to transferring, or storing, data stored in an area of the one-time PROM 18 whose address is indicated by the BA pair register 17 to an area of the RAM 14 whose address is indicated by the data pointer 13.

In the states T3 and T4 of the machine cycle M1, address data set in the upper byte H and lower byte L of the program counter 15 are stored or saved in the temporary registers 6 and 7, respectively.

In the states T2 and T3 of the machine cycle M2, address data representative of the real address X and set in the accumulator 9 and auxiliary register 10 is transferred to the program counter 15. In response, the program counter 15 takes in the address data representative of the real address X which should be designated in the one-time PROM 18.

In the state T1 of the machine cycle M3, the instruction decoder/encoder 4 delivers the control signals EROM and WTRC to the one-time PROM 18 and temporary register 7, respectively. As a result, data is read out of an area of the real address X of the one-time PROM 18 which is indicated by the BA pair register 17, and then saved in the temporary register 7.

In the state T3 of the machine cycle M3, the instruction decoder/encoder 4 feeds the control signals EALU and WM to the arithmetic and logic unit 8 and RAM 14, respectively. Consequently, the data held in the temporary register 7 is stored in an area of the RAM 14 the address of which is designated by the data pointer 13. Then, in the state T4, the address data saved in the states T3 and T4 of the machine cycle M1 and which should be set in the lower byte L of the program counter 15 is restored to the program counter 15.

Further, in the state T3 of the machine cycle M4, the address data saved in the states T3 and T4 of the machine cycle M1 and expected to be set in the upper byte H of the program counter 15 is restored to the program counter 15.

(2) Compare Instruction Procedure (FIG. 9)

A compare instruction CMP @D, @BA is executed for setting the ZERO flag of the condition code register 11 if data stored in an area of the one-time PROM 18 whose address is indicated by the BA pair register 17 and data stored in an area of the RAM 14 whose address is indicated by the data pointer 13 are identical, as follows.

The procedure up to the state T3 of the machine cycle M2 is the same as the procedure which has been described with reference to FIG. 3. In the state T4 of the machine cycle M2, the address data saved in the states T3 and T4 of the machine cycle M1 and which should be set in the lower byte (L) of the program counter 15 is restored to the program counter 15.

In the state T1 of the machine cycle M3, the instruction decoder/encoder 4 delivers the control signals EROM and WTRB to the one-time PROM 18 and temporary register 6, respectively. Consequently, data is read out of an area of the one-time PROM 18 the address of which is designated by the BA pair register 17, and then saved in the temporary register 6.

In the state T3 of the machine cycle M3, the instruction decoder/encoder 4 feeds the control signal EM and WTRB to the RAM 14 and temporary register 6, respectively. In response, data is read out of an area of the RAM 14 whose address is indicated by the data pointer 13 is saved in the temporary register 7.

In the state T4 of the machine cycle M3, the instruction decoder/encoder 4 sends control signals EALU and WZF to the arithmetic and logic unit 8 and condition code register 11, respectively. In response, the arithmetic and logic unit 8 compare the data having been stored in the temporary registers 7 and 8, and the result of comparison is recorded in the ZERO flag of the condition code register 11.

Further, in the state T3 of the machine cycle M4, the address data saved in the states T3 and T4 of the machine cycle M1 and expected to be set in the upper byte H of the program counter 15 is restored to the program counter 15.

As stated above, while the prior art microcomputer with a built-in PROM needs eleven instructions in executing the read correction program stored in the ROM 16, the present invention is practicable with only three instructions and, therefore, reduces the number of steps and processing time. The illustrative embodiment executes error correction automatically by hardware, as distinguished from the conventional program control, so that a single instruction MOV @D, @BA suffices for the data read-out and correction associated with the one-time PROM 18. Hence, despite that correction has been executed, the user can construct a program by the same period of time as when correction is not executed.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention. For example, while the switchover from the real address X to the dummy address Y has been shown in FIG. 4 as being effected by forcibly setting a particular bit (twelfth bit as counted from lowermost bit in the embodiment) of address data representative of the real address (e.g. sixteen bits) in the one-time PROM 18 to "1", the particular bit may be changed in matching relation the capacity of the one-time PROM 18. The circuitry shown in FIG. 3 and representative of the program counter 15 is only illustrative and may be replaced with any other suitable circuitry. IC cards should be understood to be merely a specific application of the present invention.

What is claimed is:

1. A self-error-correcting semiconductor memory device comprising:
   a data bus being charged to a predetermined voltage;
   a programmable ROM being interconnected to said data bus and including a first address for storing first data and a second address corresponding to the first address for storing second data identical to the first data, said data bus generating third data representative of a logical product of the first data and the second data for error correction;
   an address designating circuit being electrically connected to said programmable ROM through said data bus for outputting first and second address designating signals specifying the first and second addresses, respectively, said address designating circuit outputting said second address designating signal in response to a control signal from a control circuit by converting the first address designating signal into the second address designating signal;
   at least one temporary circuit being connected to said data bus for temporarily storing data outputted to said data bus from said programmable ROM; and
   said control circuit being electrically connected to said address designating circuit for outputting the control signal for obtaining the second address designating signal, a first read signal for causing data stored in said programmable ROM to be outputted to said data bus, a write signal for causing data existing in said data bus to be inputted to said at least one temporary circuit, and a second read signal for causing data stored in said at least one temporary circuit to be outputted to said data bus; whereby the first data stored in said first address is read out to said data bus in response to said first address designating signal and said first read signal, and said first data existing in said data bus is inputted to said at least one temporary circuit in response to said write signal; the second data stored in said second address is read out to said data bus in response to the second address designating signal and the first read signal; and the third data is formed by reading the first data stored in said at least one temporary circuit out to said data bus in response to the second read signal and taking the logical product of the first data and the second data, thereafter storing the third data in said at least one temporary register in response to the write signal.

2. A self-error-correcting semiconductor memory device in accordance with claim 1, wherein said programmable ROM includes a first address area including the first address and a second address area including the second address; said first address area having an address range from 4000H to 47FFH and said second address area having an address range from 4800H to 4FFFH.

3. A self-error-correcting semiconductor memory device in accordance with claim 1, wherein said address designating circuit includes a programmable counter for storing data designating said first address and an address changing circuit for changing data designating said first address into another data for designating said second address in response to the control signal.

4. A self-error-correcting semiconductor memory device in accordance with claim 1, wherein said data bus includes a pair of data lines each corresponding to a plurality of bits constituting data to be stored in said programmable ROM; each of said plurality of data lines being connected to a precharge means and charged with a power source by means of said precharge means.

5. A self-error-correcting semiconductor memory device in accordance with claim 1, wherein said at least one temporary circuit is a register.

6. A self-error-correcting method for operating a semiconductor memory device which includes:
   a data bus being charged to a predetermined voltage;
   a programmable ROM being interconnected to said data bus and including a first address for storing first data and a second address corresponding to the first address for storing second data identical to the first data, said data bus generating third data representative of a logical product of the first data and the second data for error correction;
   an address designating circuit being electrically connected to said programmable ROM through said data bus for outputting first and second address designating signals specifying the first and second addresses, respectively, said address designating circuit outputting said second address designating signal in response to a control signal from a control circuit by converting the first address designating signal into the second address designating signal;
   at least one temporary register being connected to said data bus for temporarily storing data outputted to said data bus from said programmable ROM; and
   said control circuit being electrically connected to said address designating circuit for outputting the control signal for obtaining the second address designating signal, a first read signal for causing data stored in said programmable ROM to be outputted to said data bus, a write signal for causing data existing in said data bus to be inputted to said at least one temporary register, and a second read signal for causing data stored in said at least one temporary register to be outputted to said data bus;
   the method comprising the steps of:
   (a) reading the first data stored in said first address out to said data bus in response to said first address designating signal and said first read signal;
   (b) storing the first data read out to said data bus in said at least one temporary register in response to the write signal;
   (c) sending the control signal to the address designating circuit;
   (d) reading the second data stored in said second address out to said data bus in response to the second address designating signal and the first read signal;
   (e) forming said third data by reading the first data stored in said at least one temporary register out to said data bus and taking the logical product of the first data and the second data in response to the second read signal; and
   (f) storing the third data formed in said data bus into said at least one temporary register in response to the write signal.

7. A self-error-correcting method in accordance with claim 6, wherein the third data is identical to either of the first data and the second data.

* * * * *